United States Patent
Kinugasa et al.

(10) Patent No.: US 8,698,930 B2
(45) Date of Patent: Apr. 15, 2014

(54) PHOTOELECTRIC CONVERSION APPARATUS, FOCUS DETECTION APPARATUS, AND IMAGE PICKUP SYSTEM

(75) Inventors: Tomohisa Kinugasa, Yokohama (JP); Daisuke Inoue, Ebina (JP); Yukihiro Kuroda, Kunitachi (JP); Kouji Maeda, Kawasaki (JP); Kazuhiro Saito, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 261 days.

(21) Appl. No.: 13/215,027

(22) Filed: Aug. 22, 2011

(65) Prior Publication Data

US 2012/0050598 A1 Mar. 1, 2012

(30) Foreign Application Priority Data

Aug. 27, 2010 (JP) .................................. 2010-191208

(51) Int. Cl.
*H04N 3/14* (2006.01)

(52) U.S. Cl.
USPC .......................................... 348/308; 348/296

(58) Field of Classification Search
USPC .................................. 348/294, 296, 302, 308
See application file for complete search history.

(56) References Cited

U.S. PATENT DOCUMENTS

| | | | | |
|---|---|---|---|---|
| 6,731,335 B1 * | 5/2004 | Kim et al. | ...................... | 348/308 |
| 6,831,692 B1 * | 12/2004 | Oda | .............................. | 348/315 |
| 7,554,074 B2 * | 6/2009 | Mheen et al. | ............. | 250/214 R |
| 7,759,756 B2 * | 7/2010 | Lee et al. | ....................... | 257/440 |
| 2008/0180554 A1 * | 7/2008 | Kobayashi et al. | ........... | 348/246 |
| 2012/0050584 A1 * | 3/2012 | Saito et al. | .................... | 348/241 |
| 2012/0050597 A1 * | 3/2012 | Maeda et al. | ................. | 348/326 |

FOREIGN PATENT DOCUMENTS

| | | |
|---|---|---|
| JP | 9-046596 A | 2/1997 |
| JP | 2000-031507 A | 1/2000 |
| JP | 2006-165754 A | 6/2006 |

\* cited by examiner

*Primary Examiner* — Timothy J Henn

(74) *Attorney, Agent, or Firm* — Canon USA, Inc. IP Division

(57) ABSTRACT

A photoelectric conversion apparatus includes a plurality of unit pixels each including a first photoelectric conversion unit and a second photoelectric conversion unit, and a pixel output unit shared by the first photoelectric conversion unit and the second photoelectric conversion unit. The first photoelectric conversion unit is configured to be depleted when it is reset, while the second photoelectric conversion unit is configured not to be depleted when it is reset.

20 Claims, 13 Drawing Sheets

PHOTOELECTRIC CONVERSION APPARATUS, FOCUS DETECTION APPARATUS, AND IMAGE PICKUP SYSTEM

BACKGROUND OF THE INVENTION

1. Field of the Invention

The present invention relates to a photoelectric conversion apparatus, and more particularly, to a photoelectric conversion apparatus for use to achieve auto focusing based on phase difference detection.

2. Description of the Related Art

In general, characteristics to be considered in designing of the photoelectric conversion apparatus include a high signal-to-noise ratio, a large dynamic range in terms of the amount of incident light, etc. Japanese Patent Laid-Open No. 9-046596 discloses a photoelectric conversion apparatus in which a floating diffusion (FD) element is used to detect the amount of an electric charge accumulated in a photodiode. In the technique disclosed in Japanese Patent Laid-Open No. 9-046596, the detection capacitance is reduced by using the photodiode in a depleted state thereby improving the signal-to-noise ratio. Furthermore, one FD element is shared by a plurality of photodiodes to allow the photodiodes to have a large light receiving area. This allows it to generate a large amount of electric charge even when the amount of incident light is small, and thus an increase in the signal-to-noise ratio can be achieved for low luminance. Japanese Patent Laid-Open No. 2006-165754 discloses a technique to change a charge-to-voltage conversion factor by adding capacitance to the FD element thereby achieving an expansion of the dynamic range.

In the technique disclosed in Japanese Patent Laid-Open No. 9-046596, although sensitivity in a low luminance condition can be increased, it is difficult to expand the dynamic range in a high luminance condition. In the technique disclosed in Japanese Patent Laid-Open No. 2006-165754, the addition of capacitance makes it difficult to achieve an increase in sensitivity in the low luminance condition. That is, it is difficult to simultaneously achieve both an increase in sensitivity and an increase in dynamic range.

SUMMARY OF THE INVENTION

In an aspect, the present invention provides a photoelectric conversion apparatus including a plurality of unit pixels each including a first photoelectric conversion unit, a second photoelectric conversion unit, a pixel output unit for outputting a signal based on an electric charge generated by at least one of the first and second photoelectric conversion units, a first transfer unit for transferring an electric charge generated by the first photoelectric conversion unit to the pixel output unit, a second transfer unit for transferring an electric charge generated by the second photoelectric conversion unit to the pixel output unit, and a resetting unit for resetting the first photoelectric conversion unit and the second photoelectric conversion unit, wherein the first photoelectric conversion unit is depleted when it is reset, and the second photoelectric conversion unit is not depleted when it is reset.

Further features of the present invention will become apparent from the following description of exemplary embodiments with reference to the attached drawings.

DESCRIPTION OF THE EMBODIMENTS

First Embodiment

A first embodiment of the present invention is described below. In this embodiment, a photoelectric conversion apparatus is applied to auto focusing (AF) based on a phase difference detection.

Figure 1:
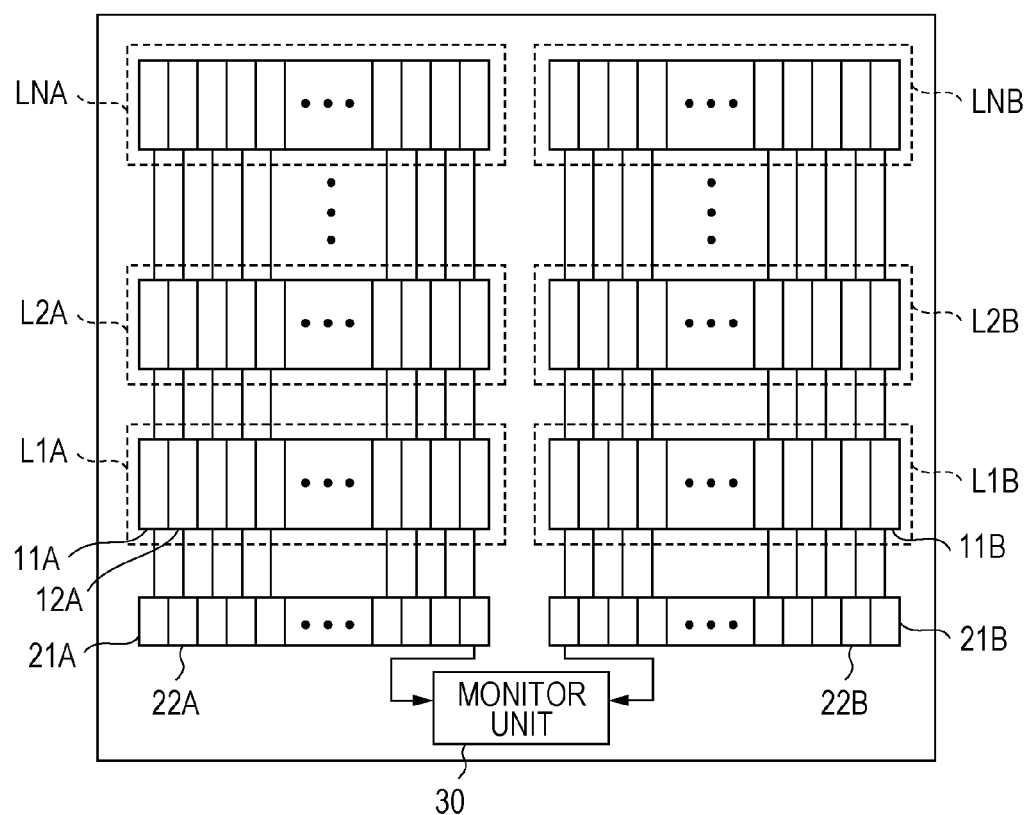
FIG. 1 is a diagram illustrating main elements of a photoelectric conversion apparatus for use in AF (auto focusing) according to an embodiment of the present invention.

FIG. 1 schematically illustrates main elements of the photoelectric conversion apparatus for use in phase difference AF according to the present embodiment. The photoelectric conversion apparatus 1 includes pairs of line sensor units L1A and L1B, L2A and L2B, ..., LNA and LNB. Each line sensor unit pair is used to measure defocus of an object in a particular area of an imaging plane. A plurality of focus measurement punts are provided by disposing a plurality of pairs of line sensor units whereby it becomes possible to achieve an improvement in AF accuracy. Each line sensor unit includes unit pixels 11A, 12A and so on each including an AF photoelectric conversion unit for detecting phase difference information and a monitor photodiode for monitoring the light intensity. The unit pixels in the respective line sensor units L1A, L2A, ..., LNA and the unit pixels in the respective line sensor units L1B, L2B, ..., LNB output signals to a monitor unit 30 or the like via common signal output units 21A, 22A, ... and signal output units 21B, 22B, and so on.

Figure 2:
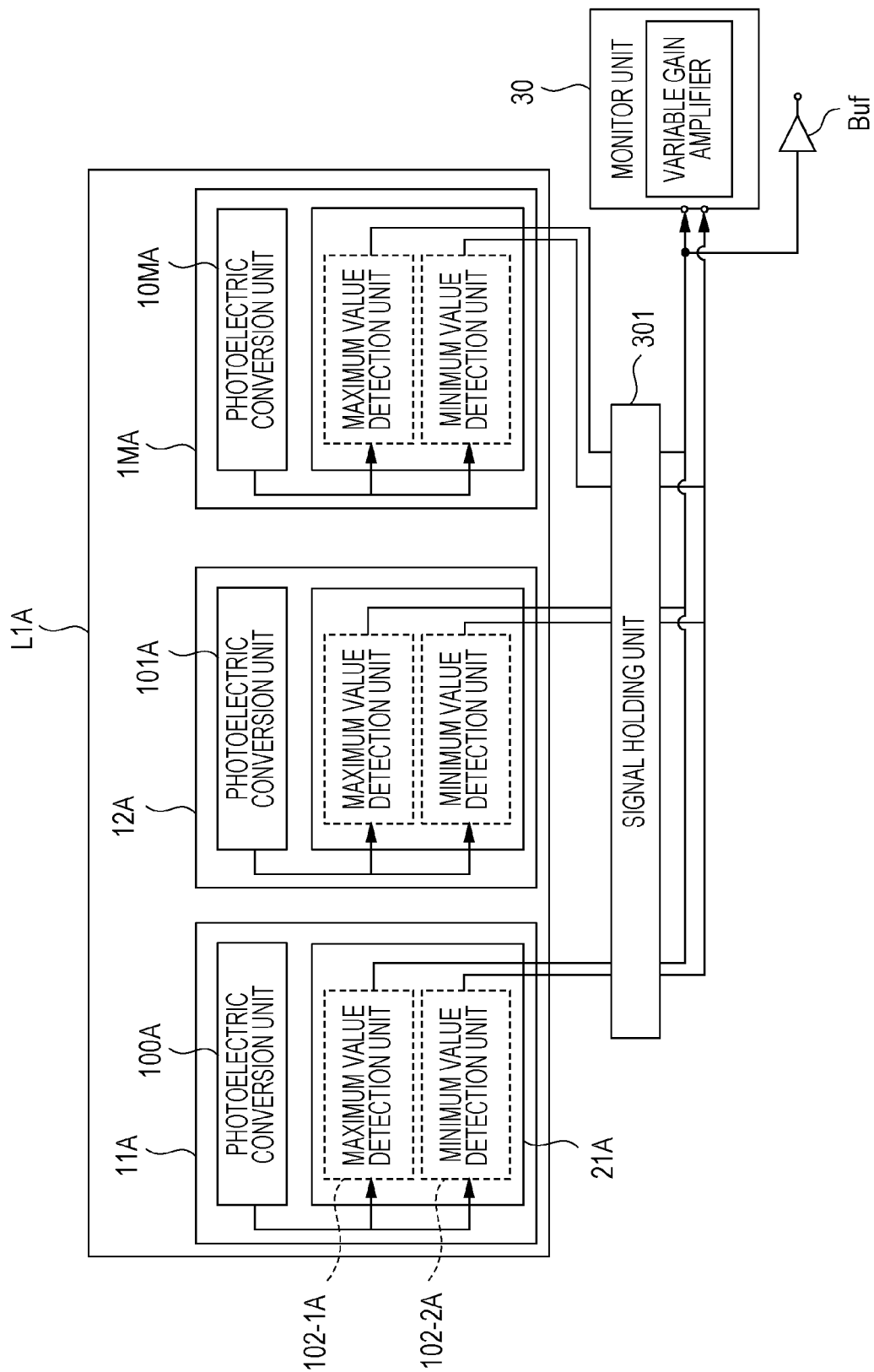
FIG. 2 is a diagram illustrating main elements of a line sensor unit according to an embodiment of the present invention.

FIG. 2 illustrates the details of the line sensor unit L1A. A unit pixel 11A includes a photoelectric conversion unit 100A and a signal output unit 21A, and a signal output unit 21A includes a maximum value detection unit 102-1A and a minimum value detection unit 102-2A. A signal output from the photoelectric conversion unit 100A is supplied to the maximum value detection unit 102-1A and the minimum value detection unit 102-2A. The maximum value detection unit 102-1A and the minimum value detection unit 102-2A may be each realized using, for example, a source follower amplifier. To increase the signal detection accuracy, a noise reduction circuit may be provided. The other unit pixels are similar in structure to the unit pixel 11A. The line sensor units L2A, L3A, ..., L1B, L2B, ..., and so on are similar in structure to the line sensor unit L1A, and thus an explanation thereof is omitted.

Signals output from the maximum value detection unit and the minimum value detection unit of each unit pixel are supplied to a monitor unit 30 via a signal holding unit 301. The signal holding unit 301 includes a holding element to temporarily hold the signal output from the maximum value detection unit and has a path that allows it to directly transfer the signals output from the maximum value detection unit and the minimum value detection unit to the monitor unit 30 without holding them. In a period in which a monitoring operation (described later) is performed, the signals are directly transferred to the monitor unit 30 without holding the signals thereby making it possible to monitor the light intensity in real time. On the other hand, when a signal is read from each unit pixel, the signal is temporarily held by the signal holding unit 301 such that the accumulation time becomes equal for all unit pixels in the line sensor unit, and the held signal is sequentially transferred by a scanning circuit (not shown) to an output buffer Buf.

Output terminals of the maximum value detection units of the unit pixels are connected together at a subsequent stage of the signal holding unit 301 and input to the monitor unit. Output terminals of the minimum value detection units are also connected together in a similar manner and input to the monitor unit. This configuration makes it possible for the monitor unit to make a real-time detection of the maximum value and the minimum value of the signal output from the line sensor unit L1A. If a signal indicating the difference between the maximum value and the minimum value (hereinafter, referred to simply as the P-B signal) exceeds a predetermined threshold value, then the monitor unit 30 outputs a signal to command the photoelectric conversion unit to end the electric charge accumulation operation. The threshold value may be changed depending on the conditions of use. The monitor unit 30 includes a variable gain amplifier that allows the signal to be amplified with a greater gain when the P-B signal does not provide a sufficiently large contrast. Although in the present embodiment, the maximum value detection unit is used to individually read signals from the respective unit pixels, the minimum value detection unit may be used instead of the maximum value detection unit.

Figure 3:
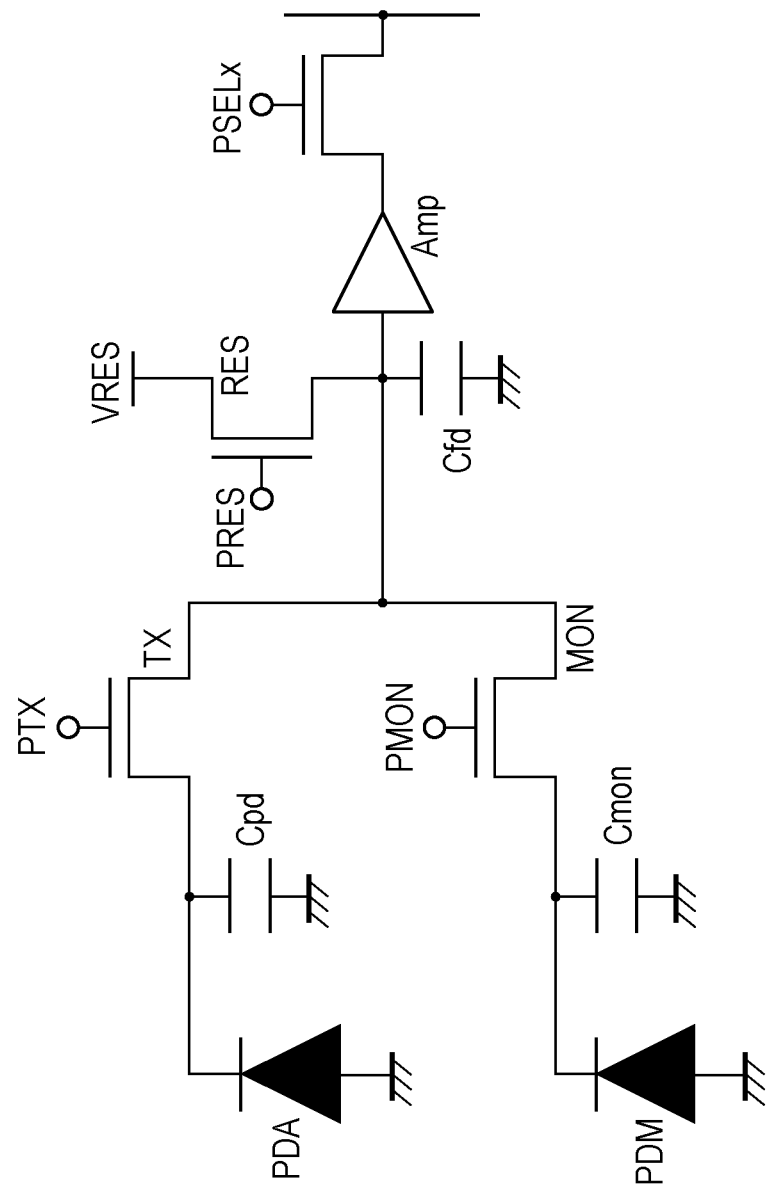
FIG. 3 is an equivalent circuit of a unit pixel according to an embodiment of the present invention.

FIG. 3 is an equivalent circuit diagram illustrating details of the photoelectric conversion/detection unit 101. In FIG. 3, PDA denotes a photodiode for detecting phase difference information, and PDM denotes a photodiode for monitoring the light intensity. An anode of the photodiode PDA is connected to an input node of an amplifier Amp via a transfer transistor TX, and an anode of the photodiode PDM is connected to the input node of the amplifier Amp via a transfer transistor MON. Cpd denotes parasitic capacitance associated with the photodiode PDA and the transfer transistor TX, and Cmon denotes parasitic capacitance associated with the photodiode PDM and the transfer transistor MON. The input node of the amplifier Amp is also connected to FD capacitance Cfd, which is capacitance of a floating diffusion element, and to a reset transistor RES. When the signal PTX turns to a high level, the transfer transistor TX turns on and an electric charge stored in the capacitance Cpd is transferred to the FD capacitance Cfd. On the other hand, when the signal PMON turns to the high level, the transfer transistor MON turns on, and an electric charge stored in the capacitance Cmon is transferred to the FD capacitance Cfd. When the signal PRES turns to the high level, the reset transistor RES turns on and the input node of the amplifier Amp is reset depending on a power supply voltage VRES. The signals PTX, PMON, PRES, and PSELx are given, for example, by a timing generator (not shown). Note that PDA corresponds to the first photoelectric conversion unit, PDM corresponds to the second photoelectric conversion unit, TX corresponds to the first transfer unit, MON corresponds to the second transfer unit, the amplifier Amp corresponds to the pixel output unit, and the reset transistor RES corresponds to the resetting unit.

Relationships among the photodiodes PDA and PDM and the power supply voltage VRES are explained below. The photodiode PDA for detecting phase difference information and the photodiode PDM for monitoring the light intensity are both reset by the reset transistor RES into a reverse-biased state. In the reverse-biased state, the photodiode PDA is depleted, but the photodiode PDM is not depleted. By setting the photodiode PDA in the depleted state, it is possible to reduce the capacitance Cpd of the photodiode PDA to a negligibly small level. On the other hand, a main component of the capacitance Cmon is parasitic capacitance of a light sensing part in the non-depleted state. The capacitance Cfd of the FD element includes capacitance associated with the transfer turns TX and MON, the reset switch RES, and the input node of the amplifier Amp, and also includes capacitance of associated interconnections. Typically, relative capacitance values are such that Cmon>Cfd>Cpd.

Figure 4A:
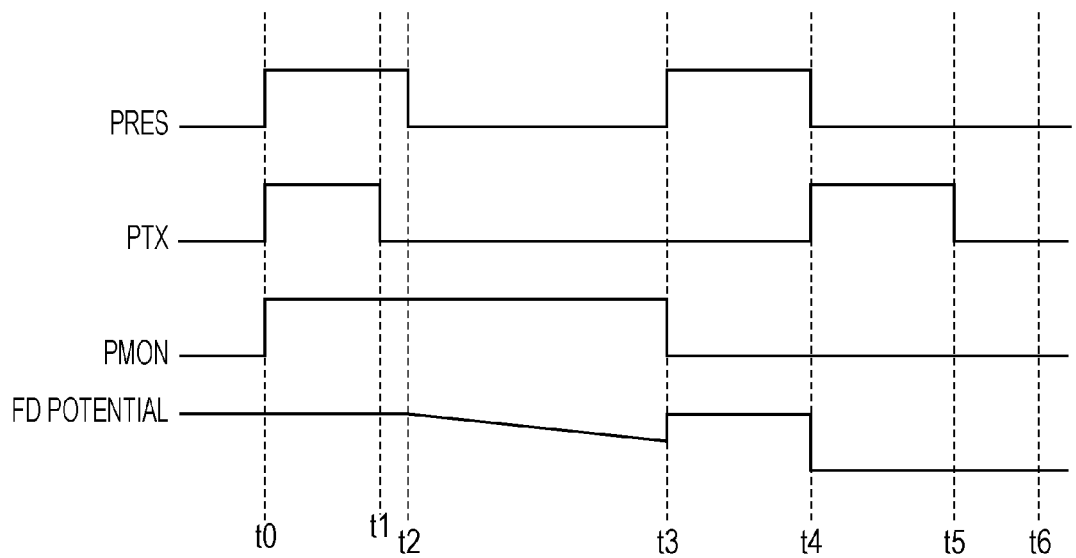
FIGS. 4A and 4B are timing charts illustrating operations according to an embodiment of the present invention.

An operation (first operation mode) of the photoelectric conversion apparatus according to the present embodiment is described below with reference to FIG. 4A. This operation mode is useful for an object with low luminance. FIG. 4A illustrates the signals PRES, PTX, and PMON and also a potential (denoted by FD potential in FIG. 4A) at the input node of the amplifier Amp. Although not shown in FIG. 4A, the signal PSELx is assumed to be at the high level over the whole period shown in FIG. 4A. Note that line sensor units are controlled such that each pair of line sensor units operates at the same time.

When the signals PRES, PTX, and PMON switch to the high level at time to, the reset transistor RES and the transfer transistors TX and MON turn on in response to the low-to-high transition of the signals PRES, PTX, and PMON. As a result, the photodiodes PDA and PDM and the input node of the amplifier Amp are reset by the power supply voltage VRES.

When the signal PTX turns to the low level at time t1, the transfer transistor TX turns off, and thus the photodiode PDA switches into a state in which an electric charge can be accumulated. At this point of time, the reset transistor RES is in the on-state, and thus no change occurs in the FD potential.

When the signal PRES turns to the low level at time t2, the reset transistor RES turns off, and thus the photodiode PDM is released from the reset state. At this point of time, the FD potential starts to change due to an electric charge generated in the photodiode PDM. After time t2, if the P-B signal detected by the monitor unit 30 exceeds a predetermined threshold value at time t3, the signal PRES turns to the high level and the signal PMON turns to the low level. As a result, the photodiode PDM is disconnected from the input node of the amplifier Amp, and the FD potential is reset by the power supply voltage VRES.

The PTX turns to the high level at time t4 and remains at the high level during a following period till time t5. During this period, the electric charge accumulated in the photodiode PDA for detecting the phase difference information is transferred to the FD capacitance Cfd. At this point of time, the process of controlling the accumulation time of the photodiode PDA for detecting the phase difference information is complete.

In a period starting at time t6, the signals output from the respective maximum value detection units are sequentially transferred by a scanning circuit (not shown) to the output buffer Buf. Thus, the signals from the respective unit pixels are obtained. In the operation described above, after the transfer transistor MON is turned off at time t3, the electric charge accumulated in the photodiode PDA is transferred to the FD capacitance Cfd. As a result, the FD capacitance Cfd is given only by the capacitance associated with the input node of the amplifier Amp when the phase difference information is detected, which makes it possible to achieve a large charge-to-voltage conversion factor. In other words, even when the amount of the electric charge generated in the photodiode PDA is small, it is possible to detect the electric charge as a voltage signal. This makes it possible to achieve an in-focus state for an object even when the luminance of the object is low.

Figure 4B:
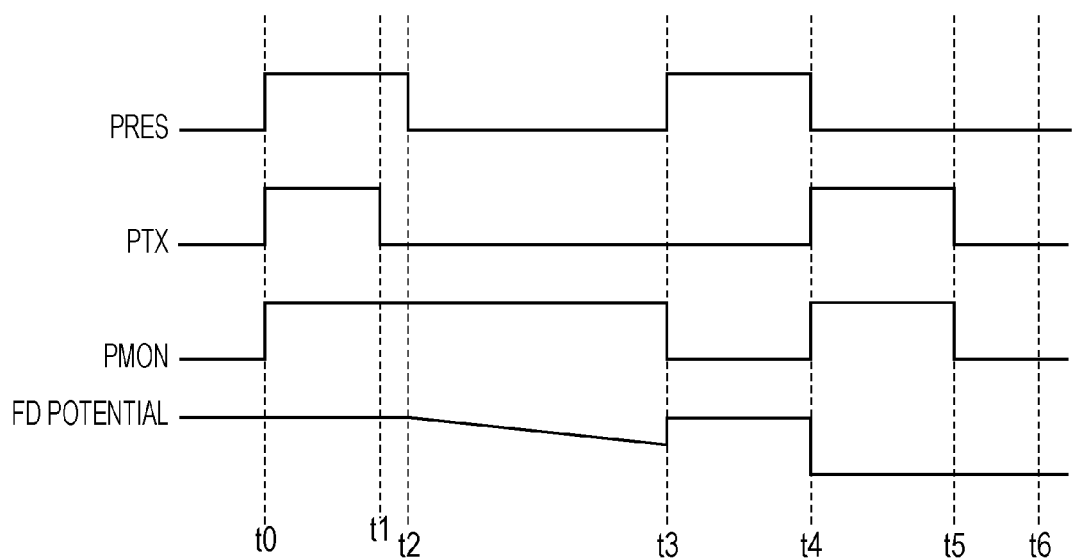

Next, an operation of the photoelectric conversion apparatus according to the present embodiment is described below with reference to FIG. 4B. This operation mode is useful for an object with high luminance. The operation is different from that described above with reference to FIG. 4A in that during the period from time t4 to time t5, the signal PMON is at the high level and the photodiode PDM for monitoring the light intensity is electrically connected to the FD element.

In this operation, when the electric charge accumulated in the photodiode PDA is transferred to the FD capacitance Cfd, the capacitance associated with the input node of the amplifier Amp is given by the sum of the FD capacitance Cfd and the capacitance Cmon of the photodiode PDM. This results in a reduction in the charge-to-voltage conversion factor, which makes it possible to expand the range in which the electric charge is detectable as a voltage signal even for an object with high luminance without saturation.

In the present embodiment, when the resetting is performed, the photodiode PDA is depleted but the photodiode PDM is not completely depleted. Thus, for low luminance, the small value of the capacitance Cpd makes it possible to achieve a large charge-to-voltage conversion factor, while for high luminance, the addition of the large capacitance Cmon allows it to reduce the charge-to-voltage conversion factor. Thus, it is possible to handle a wide range of luminance. In particular, in a low luminance range, the small capacitance of the photodiode PDA can lead to an increase in sensitivity.

By switching the operation between the first mode described above with reference to FIG. 4A and the second mode described above with reference to FIG. 4B depending on the luminance of the object, it is possible to expand the dynamic range in which high-accuracy detection is possible.

Next, a description is given below as to a level at which the electric charge accumulation operation of each unit pixel is ended according to a determination performed by the monitor unit 30. Let G denote a gain obtained for a signal output from a unit pixel before the signal is input to the monitor unit 30. Furthermore, let Vhigh denote a signal that is input to the monitor unit 30 when the gain is high, i.e., when the luminance is low, and let Vlow denote a signal that is input to the monitor unit 30 when the gain is low, i.e., when the luminance is high, then these signals are given as follows:

For low luminance:

$$Vhigh = G \times \frac{Qpd}{Cfd + Cpd} \quad (1)$$

For high luminance:

$$Vlow = G \times \frac{Qpd + Qmon}{Cmon + Cfd + Cpd} \quad (2)$$

where Qpd denotes the amount of electric charge generated in the photodiode PDA, and Qmon denotes the amount of electric charge generated in the photodiode PDM. As can be seen from equations (1) and (2), the amplitude of the signal varies depending on whether the luminance is high or low. However, it may be convenient to maintain the amplitude of the signal input to the monitor unit 30 within a predetermined range regardless of the conditions of the object. If the target value is denoted as Vtarget and if the signal input to the monitor unit 30 at time t is denoted as Vagc(t), then the Vtarget is given as follows:

For low luminance:

$$Vtarget \times \frac{Vhigh}{Vagc} = \frac{Qpd}{Qmon} \times \frac{Cmon + Cfd}{Cfd + Cpd} \quad (3)$$

For high luminance:

$$Vtarget \times \frac{Vlow}{Vagc} = \frac{Qpd + Qmon}{Qmon} \times \frac{Cmon + Cfd}{Cmon + Cfd + Cpd} \quad (4)$$

Figure 5:
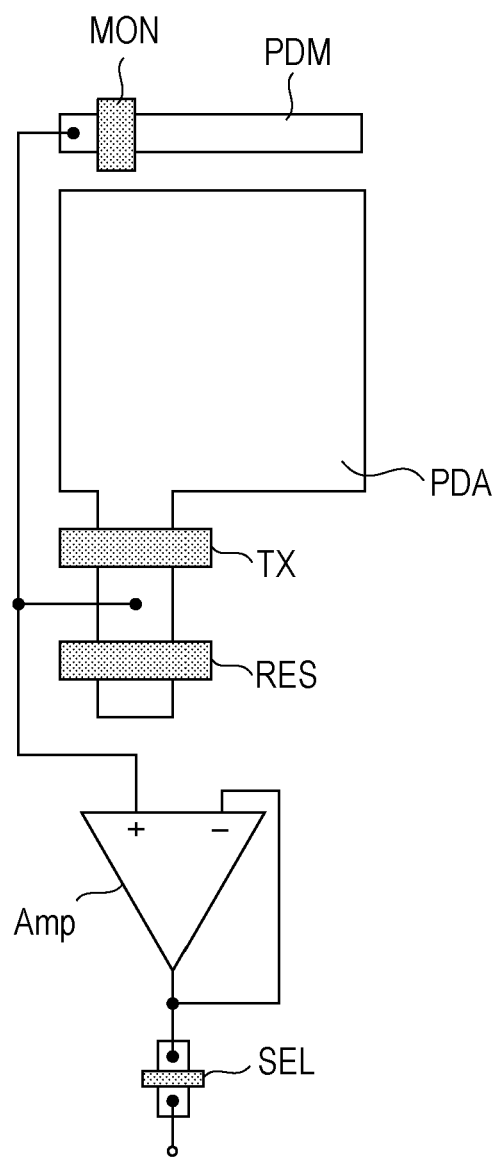
FIG. 5 is a planar layout diagram of a unit pixel according to an embodiment of the present invention.

FIG. 5 illustrates an example of a layout of a unit pixel formed on a semiconductor substrate according to the present embodiment. In the layout shown in FIG. 5, by way of example, the amplifier Amp is realized by a voltage follower using an operational amplifier.

In FIG. 5, unit pixels 11A, 12A, . . . are arranged in a first direction, while the photodiode PDA and the photodiode PDM are arranged in a second direction perpendicular to the first direction. In an AF photoelectric conversion apparatus, if the photodiode PDA and the photodiode PDM in the unit pixel are arranged in the first direction, it is difficult to achieve a small pixel pitch. Besides, because monitoring is performed based on light incident at a location shifted in the first direction in the unit pixel, there is a possibility that a reduction occurs in monitoring accuracy.

In the layout shown in FIG. 5, to avoid the problem described above, monitoring can be performed based on light incident at a location that is not shifted in the first direction. This makes it possible to achieve a reduction in pixel pitch and an increase in monitoring accuracy.

The photodiode PDA may be configured to have a smaller light receiving area than that of the photodiode PDM so that the photodiode PDA can generate a greater amount electric charge by which phase difference information is provided.

Second Embodiment

A second embodiment is described below.

Figure 6A:
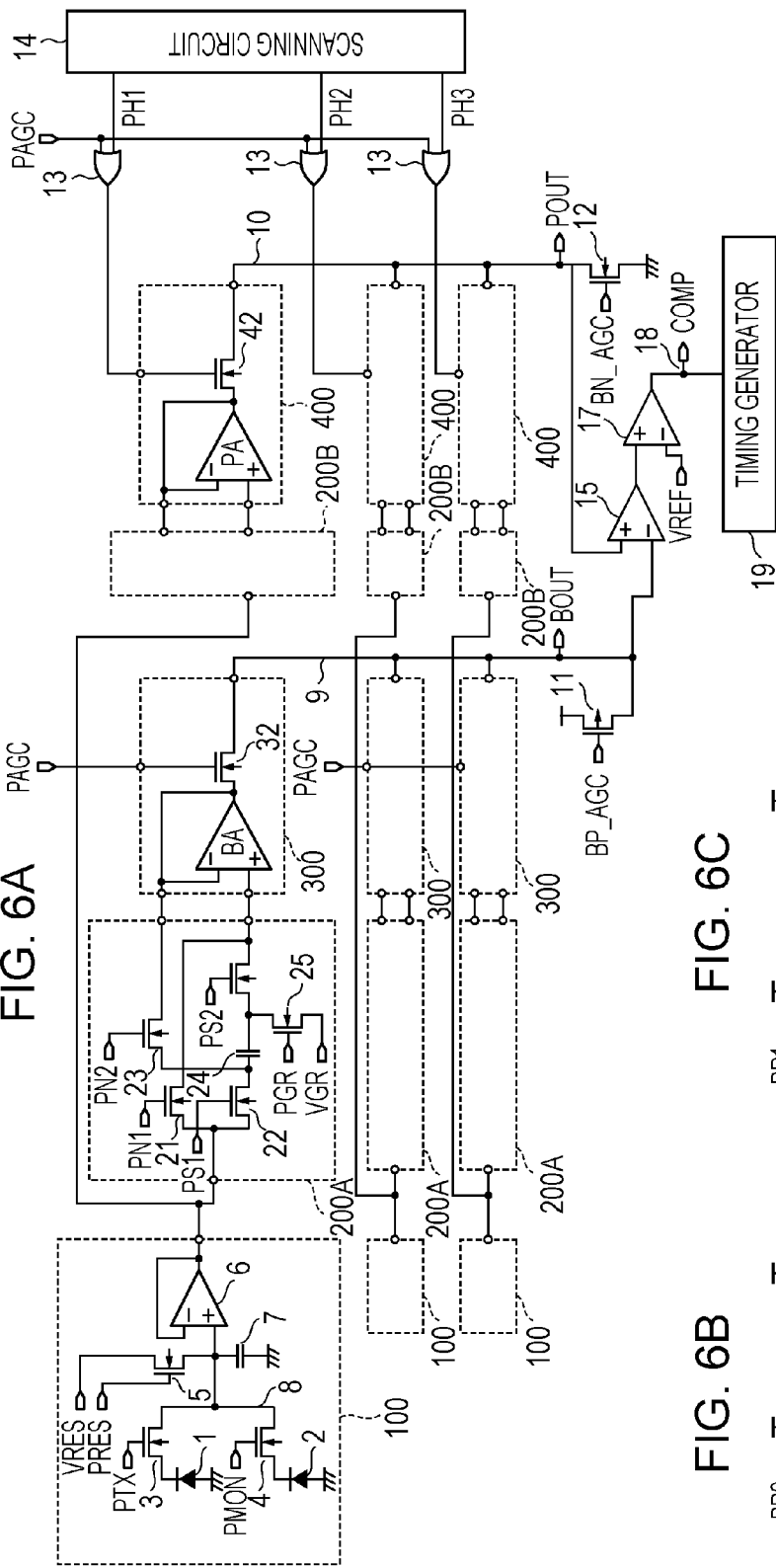
FIGS. 6A, 6B, and 6C are diagrams illustrating main elements of a line sensor unit according to an embodiment of the present invention.

The second embodiment discloses a configuration that includes an offset canceling circuit serving as a noise reduction circuit in addition to elements included in the configuration according to the first embodiment described above. FIG. 6A is circuit diagram schematically illustrating a line sensor unit L1A. Note that although only three pixels are shown in this diagram, the line sensor unit L1A may include a greater number of pixels. For simplicity of illustration, the selection switch SEL in the unit pixel shown in FIG. 3 is omitted. A timing generator 19 outputs signals PTX, PMON, PRES, PSEL, PAGC, etc. to control the operation of the photoelectric conversion apparatus.

In FIG. 6A, a first offset canceling circuit 200A is for the minimum value detection unit, while a second offset canceling circuit 200B is for the maximum value detection unit.

Each minimum value detection unit includes a differential amplifier BA and a switch 32, and is configured such that the output of the differential amplifier BA is fed back to the first offset canceling circuit 200A. Outputs of a plurality of minimum value detection units are connected in common to a signal line 9 such that a signal output from a terminal BOUT is supplied to the monitor unit 30. The switches of the respective minimum value detection units are controlled by a common signal PAGC.

Figure 6C:
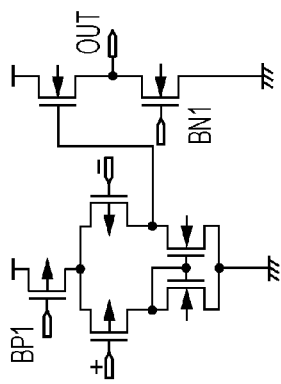
Figure 6B:
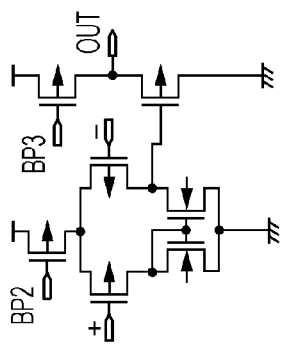

FIG. 6B illustrates an example of a configuration of the differential amplifier BA in the minimum value detection unit. The differential amplifier BA includes a differential amplifier part and a source follower output stage. A signal BP2 is given from the outside to control a current flowing through a differential input stage. A signal BP3 controls a constant current source of the source follower output stage.

A transistor 11 connected to the signal line 9 operates such that when the switch of minimum value detection unit turns on in response to the signal PAGC, the transistor 11 functions as a constant current source of the source follower output stage. FIG. 6C illustrates an example of a configuration of a differential amplifier PA in the maximum value detection unit. The differential amplifier PA is similar to the differential amplifier BA except that the polarity of the source follower output stage is opposite.

Each maximum value detection unit includes a differential amplifier PA and a switch 42, and is configured such that the output of the differential amplifier PA is fed back to the second offset canceling circuit 200B. Outputs of a plurality of maximum value detection units are connected in common to a signal line 10 such that a signal output from a terminal POUT is supplied to the monitor unit 30. A signal BP1 is given from the outside to control a current flowing through a differential input stage. A signal BN1 controls a constant current source of the source follower output stage.

The switches of the maximum value detection units are controlled by the common signal PAGC and are also controllable by signals PH1, PH2, . . . output from the scanning circuit such that the signals output from the respective unit pixels are read individually.

A transistor 12 connected to the signal line 10 operates such that when the switch of the maximum value detection unit turns on in response to the signal PAGC, the transistor 12 functions as a constant current source of the source follower output stage.

The monitor unit 30 includes a differential amplifier 15 and a comparator 17. The differential amplifier 15 is connected such that the signal line 9 is connected to an inverting input terminal and the signal line 10 is connected to a non-inverting input terminal. That is, when the minimum value detection units and the maximum value detection units are simultaneously connected, in response to the signal PAGC, to the corresponding signal lines, the difference between the maximum value and the minimum value of the signal output from the line sensor unit L1A is output as the P-B signal. When the comparison result of the P-B signal with respect to the reference signal VREF is inverted, the timing generator 19 controls the electric charge accumulation operation of each unit pixel to end.

Figure 7:
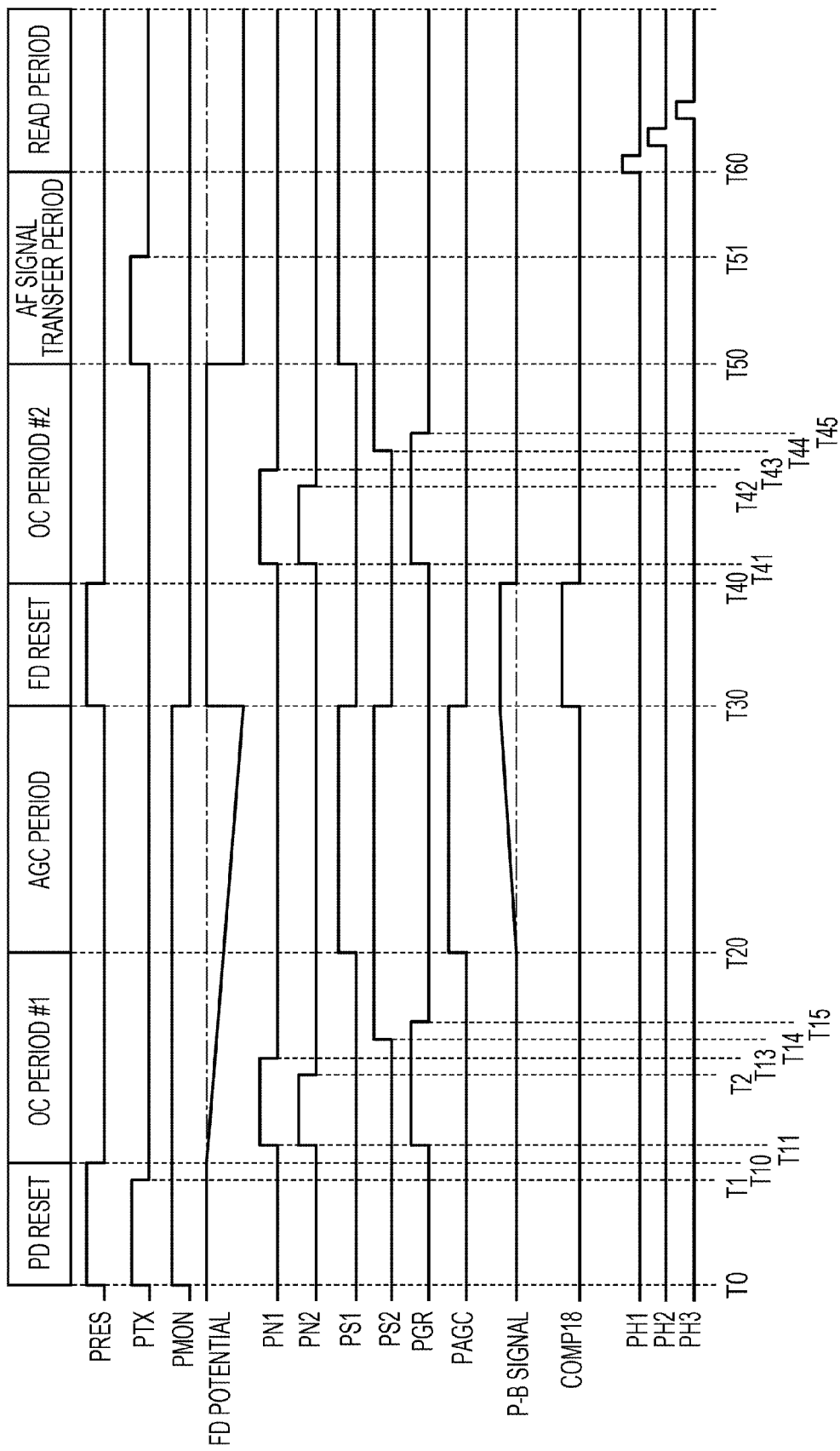
FIG. 7 is a timing chart illustrating an operation according to an embodiment of the present invention.

Next, referring to FIG. 7, an operation of the photoelectric conversion apparatus according to the present embodiment is described below. In the description, a similar operation to that according to the first embodiment is not further explained. During a PD resetting period from time t0 to time t10, the operation of resetting the photodiodes is performed in a similar manner as in the first embodiment described above. During this period, signals PN1, PN2, PS1, PS2, PGR, and PAGC associated with the first and second offset canceling circuits 200A and 200B are at the low level.

An offset cancel (OC) period #1 is in a period in which the photodiode PDA for detecting phase difference information accumulates an electric charge. When the signals PN1, PN2, and PGR switch to the high level at time t11, switches 21, 23, and 25 turn on. As a result, a signal output from the unit pixel is applied to the differential amplifier BA via the switch 21, and a signal output from the differential amplifier BA is supplied to one terminal of a clamping capacitor 24 via the switch 23. This signal includes an offset of the differential amplifier BA.

The signal PN2 turns to the low level at time t12 and then the signal PN1 turns to the level. Correspondingly, the switch 23 and the switch 21 turn off. When the signal PS2 turns to the high level at time t14, the switch 28 turns on. As a result, a node of a non-inverting input terminal of the differential amplifier BA is reset by a clamp voltage VGP. When the signal PGR turns to the low level at time t15, the other terminal of the clamping capacitor 24, i.e., the node of the non-inverting input terminal of the differential amplifier BA is brought into an electrically floating state. As a result, the clamping capacitor holds, across it, a voltage equal to the voltage of the signal output from the unit pixel plus the offset voltage of the differential amplifier BA minus the clamp voltage.

During an AGC period, which starts at time t20, the signals PS1 and PAGC switch to the high level. In response, the signal output from the unit pixel is supplied to one terminal of the clamping capacitor 24 via the switch 22. That is, only a voltage corresponding to a voltage change with respect to the voltage level clamped at time t15 is transferred to the differential amplifier BA. As a result of the signal feedback to the differential amplifier BA, the signal output from the differential amplifier BA does not include the offset of the differential amplifier BA.

After time t20, if the logic level of a signal COMP 18 output from the monitor unit 30 is inverted at time t30, the AGC period ends. During an FD reset period following time t30, in response to the inversion of the signal COMP 18, the monitor unit 30 turns the signal PRES to the high level to reset the FD capacitance Cfd, and turns the signal PMON to the low level to electrically disconnect the photodiode PDM for monitoring the light intensity from the FD capacitance Cfd. In addition, the signals PS1, PS2, and PAGC are turned to the low level.

When the signal PRES turns to the low level at time t40, the input node of the amplifier Amp is released from the reset state. An operation performed during an OC period #2 from time t40 to time t50 is similar to the operation during the OC period #1 except that the signal PMON is at the low level. That is, during this period, the offset cancelling operation is performed in a state in which the photodiode PDM for monitoring the light intensity is electrically disconnected from the input node of the amplifier Amp.

At time t50, an AF signal transfer period starts, and the signal PTX is turned to the high level to transfer the electric charge accumulated in the photodiode PDA for detecting phase difference information to the FD capacitance Cfd. The signal PS1 and the signal PS2 are at the high level, and thus the signal, including reduced noise generated in the unit pixel and including the reduced offset of the differential amplifier BA, is output from the differential amplifier BA. The second offset canceling circuit 200B and the maximum value detection unit operate in a similar manner.

During a read period, which starts at time t60, signals PH1, PH2, PH3, . . . are sequentially output from the scanning circuit. In response, signals based on the electric charges accumulated in the photodiodes PDA for detecting phase difference information are sequentially output from the output terminal POUT.

In addition to the advantages achieved in the first embodiment described above, the second embodiment provides an advantage that the noise generated in the unit pixel and the offsets that occur in the maximum value detection unit and the minimum value detection unit are suppressed, and thus it becomes possible to detect the signal with higher accuracy.

Third Embodiment

Figure 8:
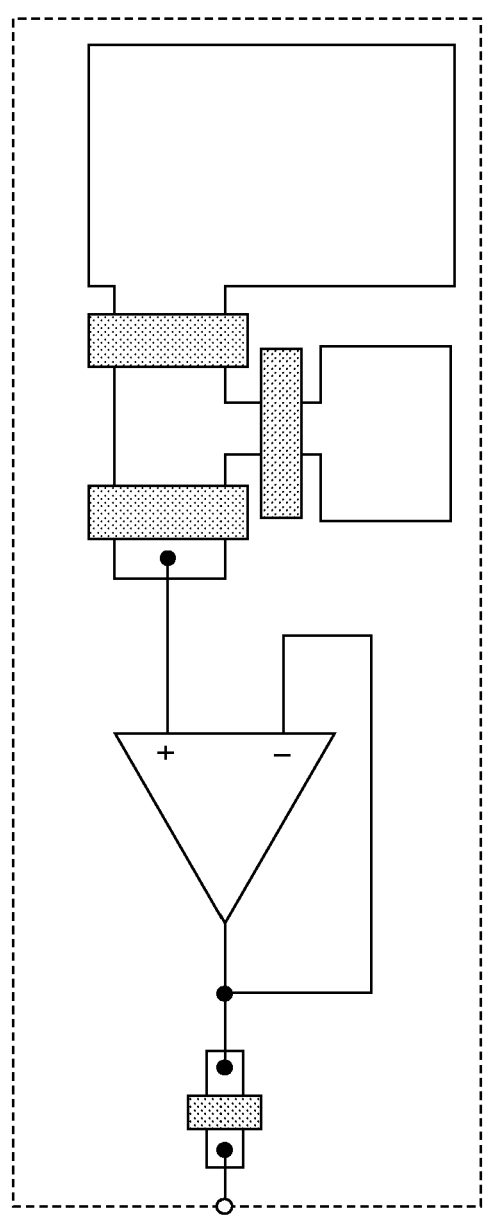
FIG. 8 is a planar layout diagram of a unit pixel according to an embodiment of the present invention.

FIG. 8 illustrates an example of a layout of a unit pixel formed on a semiconductor substrate according to a third embodiment.

In the layout according to the present embodiment, the photodiode PDM is located closer to the FD element than in the layout shown in FIG. 5, which allows it to reduce the interconnection between the photodiode PDM and the FD element. This results in a reduction in the capacitance associated with the input node of the amplifier Amp, and thus it is possible to achieve an improvement in sensitivity.

Fourth Embodiment

Figure 9:
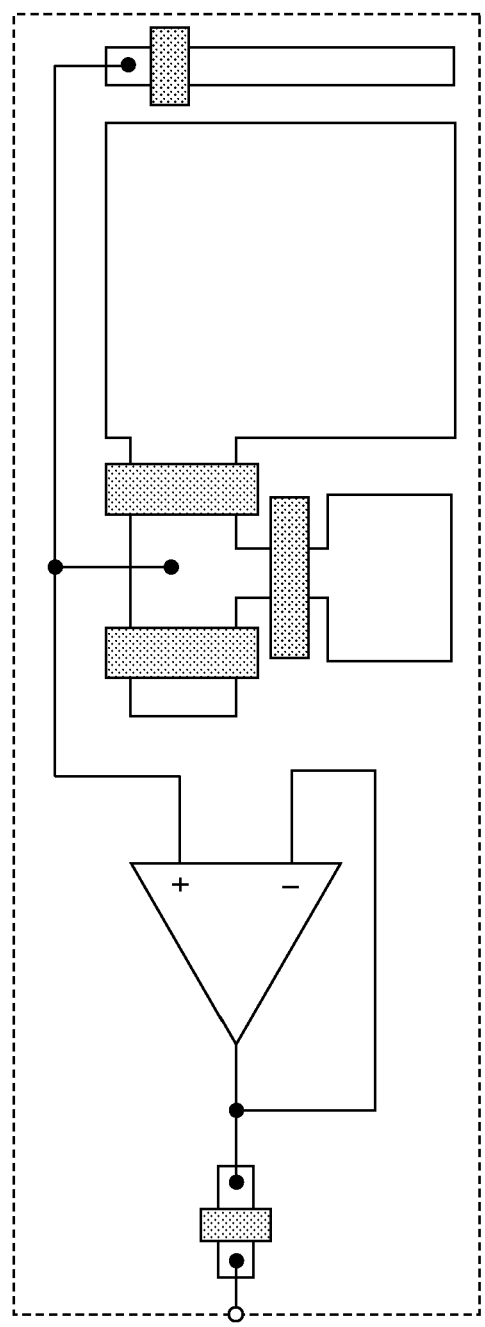
FIG. 9 is a planar layout diagram of a unit pixel according to an embodiment of the present invention.

FIG. 9 illustrates an example of a layout of a unit pixel formed on a semiconductor substrate according to a fourth embodiment.

In the present embodiment, the photodiode for monitoring the light intensity includes two photoelectric conversion areas arranged in the second direction such that the photodiode PDA is located between the two photoelectric conversion areas. This configuration makes it possible to precisely control the accumulation time even in a case where the luminance distribution extends in the second direction.

Fifth Embodiment

Figure 10:
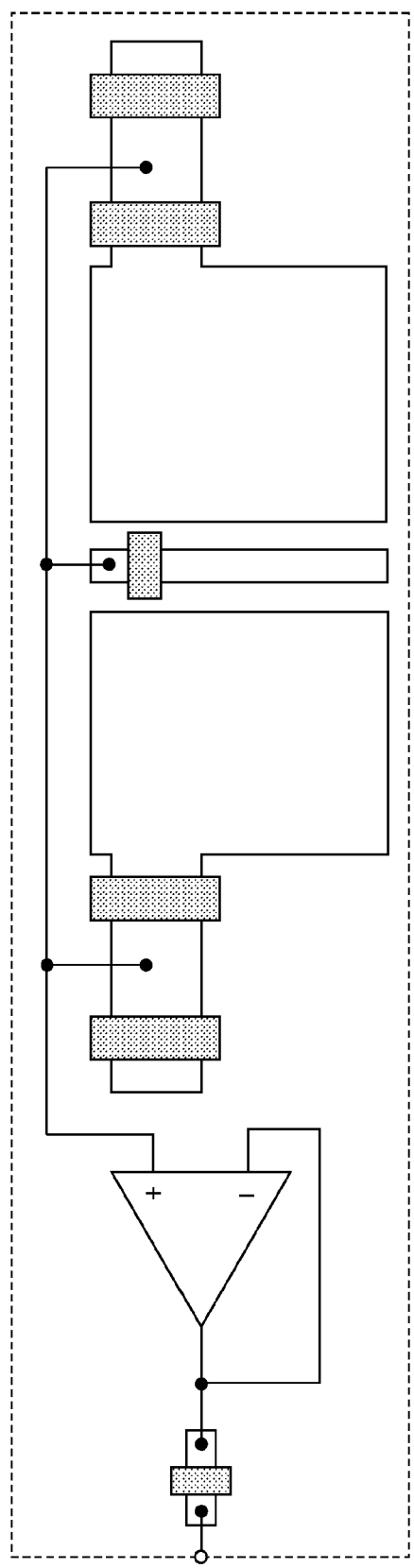
FIG. 10 is a planar layout diagram of a unit pixel according to an embodiment of the present invention.

FIG. 10 illustrates an example of a layout of a unit pixel formed on a semiconductor substrate according to a fifth embodiment.

In this embodiment, the photodiode for detecting phase difference information includes two photoelectric conversion areas PDA1 and PDA2 arranged such that the photodiode PDM for monitoring the light intensity is located between the two photoelectric conversion areas PDA1 and PDA2. In this configuration, the photodiode for monitoring the light intensity located between the two photoelectric conversion areas PDA1 and PDA2 makes it possible to precisely control the accumulation time even in a state in which the luminance of the object varies greatly between the photoelectric conversion areas PDA1 and PDA2 of the photodiode.

Sixth Embodiment

Figure 11:
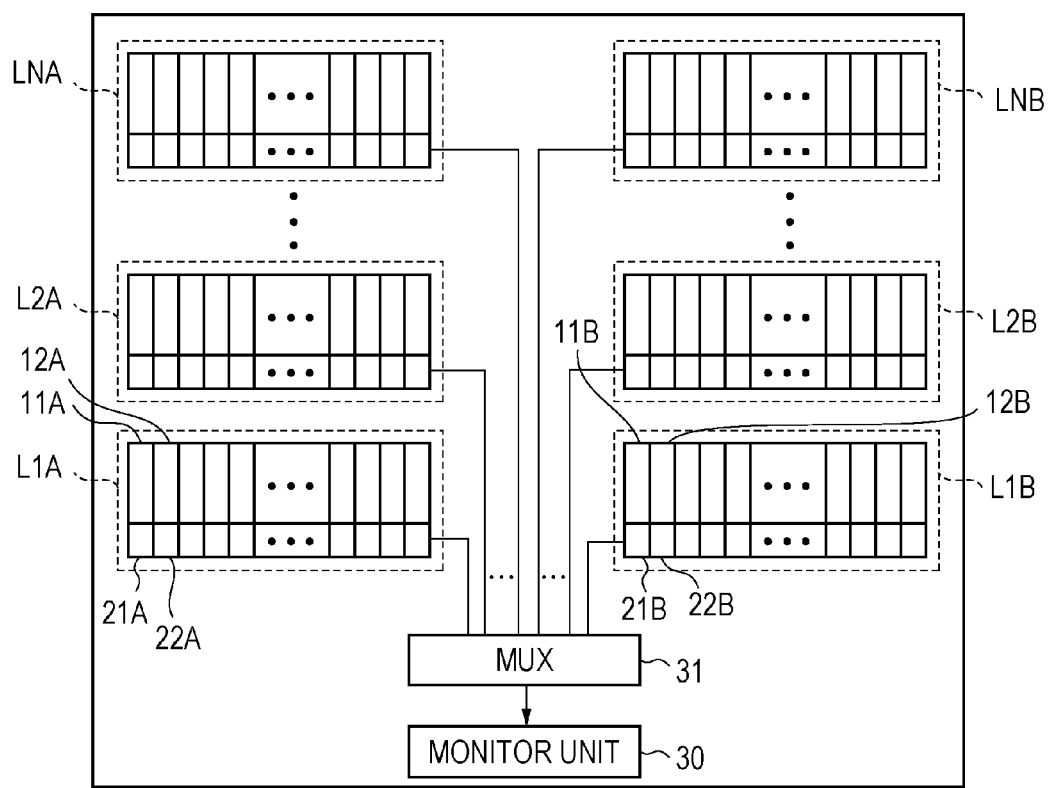
FIG. 11 is a diagram illustrating main elements of a photoelectric conversion apparatus for use in AF (auto focusing) according to an embodiment of the present invention.

FIG. 11 schematically illustrates main elements of a photoelectric conversion apparatus for phase difference AF according to a sixth embodiment of the invention. The following description will focus on differences from the photoelectric conversion apparatus according to the first embodiment described above.

In this embodiment, the photoelectric conversion apparatus 1' includes pairs of line sensor units L1A and L1B, L2A and L2B, . . . , LNA and LNB. Each line sensor unit pair is used to measure defocus of an object in a particular area of an imaging plane. A plurality of focus measurement points are provided by disposing a plurality of pairs of line sensor units whereby it becomes possible to achieve an improvement in AF accuracy. Each line sensor unit includes unit pixels 11A, 12A, . . . each including an AF photoelectric conversion unit for detecting phase difference information, and a monitor photoelectric conversion unit for detecting the light intensity. The unit pixels of the line sensor units L1A, L2A, . . . , LNA and the line sensor units L1B, L2B, . . . , LNB respectively include signal output units 21A, 22A, . . . and 21B, 22B and so on whereby signals are output to a MUX (multiplexer) 31 or the like via the signal output units 21A, 22A, . . . and 21B, 22B and so on. The MUX 31 selects one of the signals and outputs the selected signal to the monitor unit 30.

Figure 12:
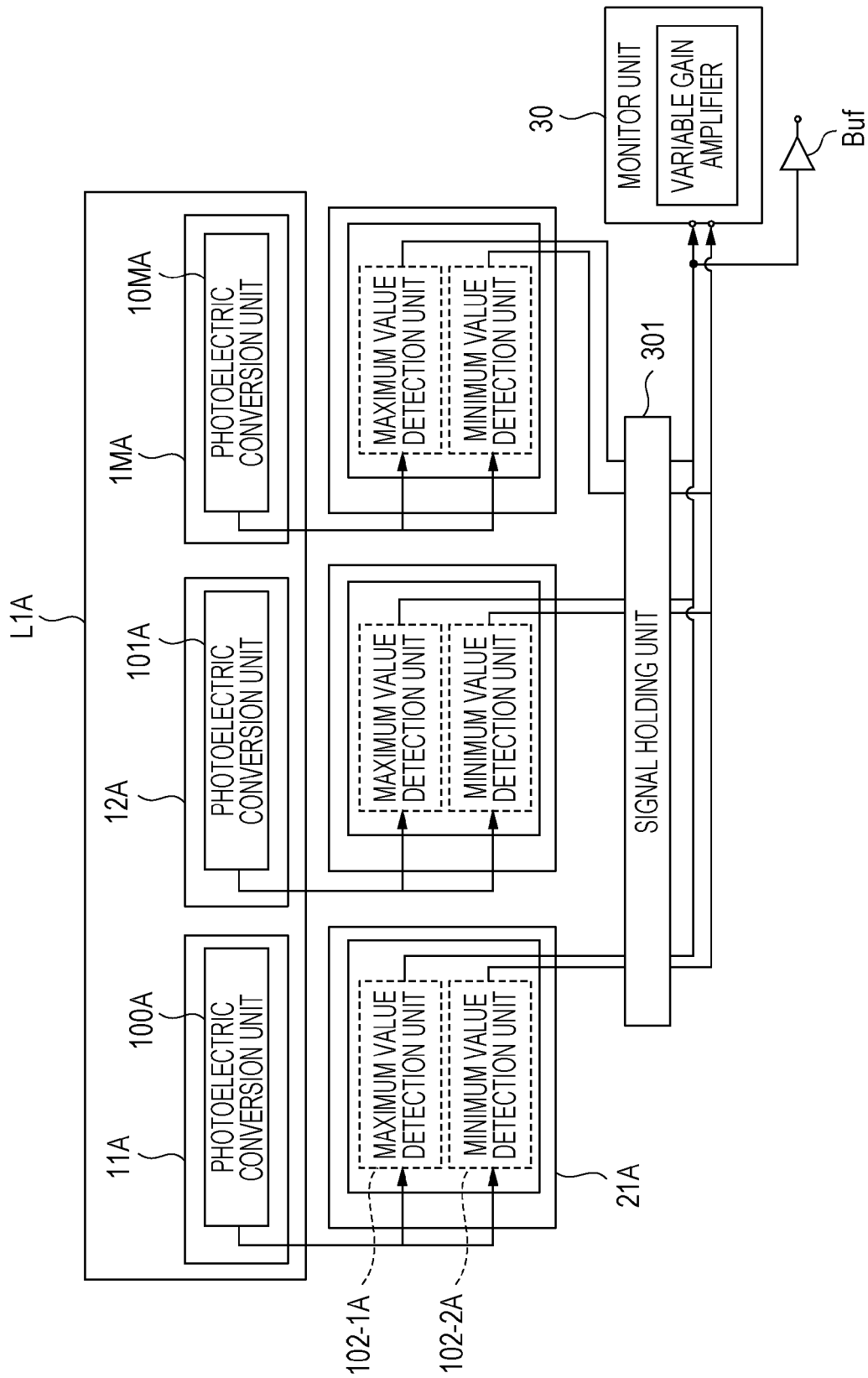
FIG. 12 is a diagram illustrating main elements of a line sensor unit according to an embodiment of the present invention.

FIG. 12 illustrates the details of the line sensor unit L1A. A unit pixel 11A includes a photoelectric conversion unit 100A, and a signal output unit 21A includes a maximum value detection unit 102-1A and a minimum value detection unit 102-2A. A signal output from the photoelectric conversion unit 100A is supplied to the maximum value detection unit 102-1A and the minimum value detection unit 102-2A via a signal holding unit. The maximum value detection unit 102-1A and the minimum value detection unit 102-2A may be each realized using, for example, a source follower amplifier. To increase the signal detection accuracy, a noise reduction circuit may be provided. The other unit pixels are similar in structure to the unit pixel 11A. The line sensor units L2A, L3A, . . . , L1B, L2B, . . . , and so on are similar in structure to the line sensor unit L1A, and thus an explanation thereof is omitted.

The photoelectric conversion apparatus configured in the above-described manner according to the present embodiment provides advantages similar to those achieved by the previous embodiments.

Seventh Embodiment

Figure 13:
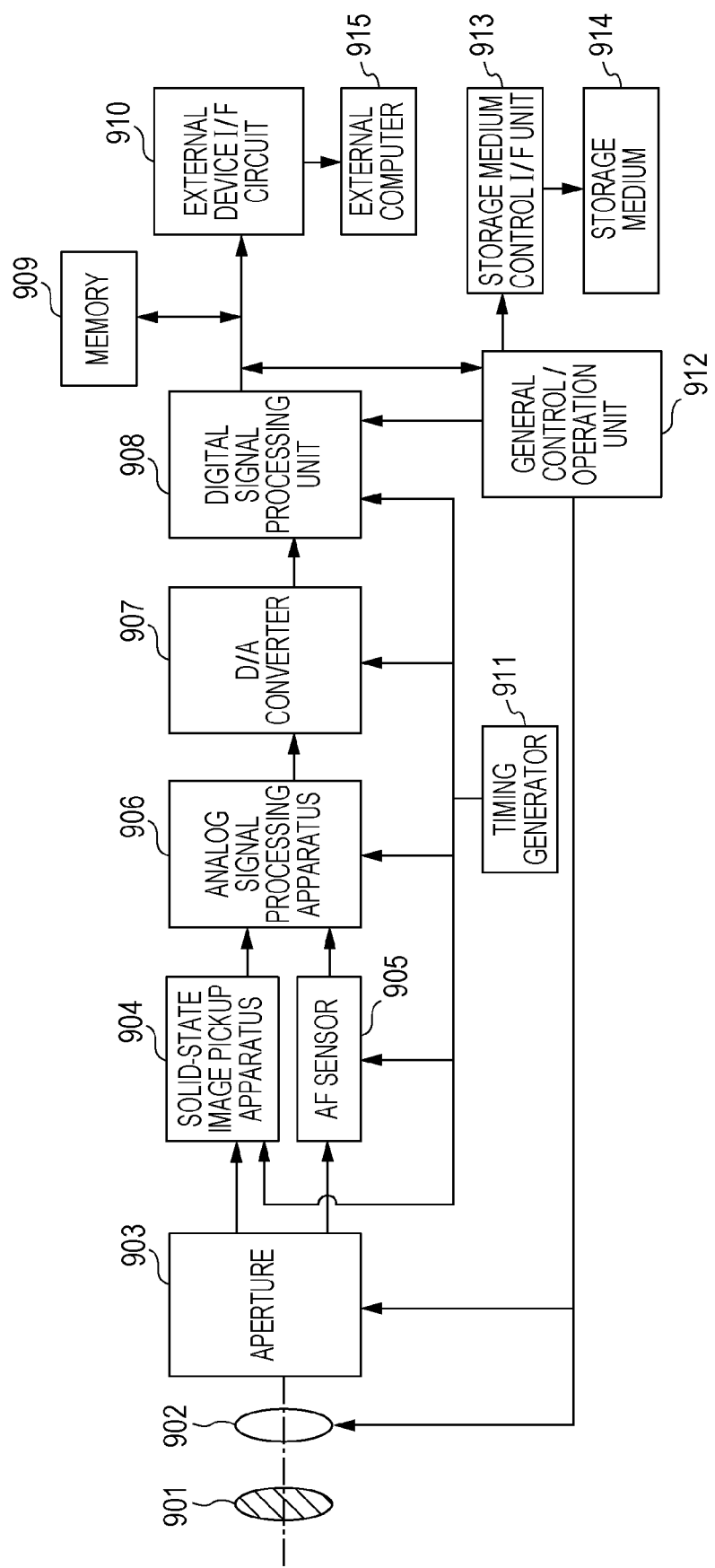
FIG. 13 is a block diagram illustrating an example of a configuration of an image pickup system according to an embodiment of the present invention.

FIG. 13 is a block diagram illustrating an example of a configuration of an image pickup system according to a seventh embodiment of the present invention.

In FIG. 13, reference numeral 901 denotes a barrier for protecting a lens, which will be described below. Reference numeral 902 denotes a lens that forms an optical image of an object on a solid-state image pickup apparatus 904. Reference numeral 903 denotes an aperture for adjusting the amount of light after the light passes through the lens. The solid-state image pickup apparatus 904 generates an image signal corresponding to the optical image formed by the lens. Reference numeral 905 denotes an AF sensor using a photoelectric conversion apparatus according to one of the previous embodiments described above.

Reference numeral 906 denotes an analog signal processing apparatus that processes a signal output from the solid-state image pickup apparatus 904 and a signal output from the AF sensor 905. Reference numeral 907 denotes an analog-to-digital converter that performs an analog-to-digital conversion on a signal output from the signal processing apparatus 906. Reference numeral 908 denotes a digital signal processing unit that performs various kinds of processing on image data output from the analog-to-digital converter 907. The processing may include correction processing, data compression processing, etc.

Reference numeral 909 denotes a memory for temporarily storing image data. Reference numeral 910 denotes an external device I/F circuit for interfacing with an external computer or the like. Reference numeral 911 denotes a timing generator that outputs various timing signals to the digital signal processing unit 908 and other units. Reference numeral 912 denotes a general control/operation unit that performs various calculations and controls the whole camera. Reference numeral 913 denotes a storage medium control I/F unit. Reference numeral 914 denotes a removable storage medium such as a semiconductor memory for storing and reading acquired image data. Reference numeral 915 denotes an external computer.

When an image is taken, the image pickup system operates as follows. When the barrier 901 is opened and a signal is output from the AF sensor 905, the general control/operation unit 912 calculates the distance to a subject based on the phase difference detection. Subsequently, based on the result of the calculation, the general control/operation unit 912 drives the lens 902 to try to achieve focus. A determination is then made as to whether an in-focus state is achieved. If it is determined that focus is not achieved yet, the lens 902 is again driven until focus is achieved. After focus has been achieved, the solid-state image pickup apparatus 904 starts an electric charge accumulation operation. If the electric charge accumulation operation of the solid-state image pickup apparatus 904 is completed, an image signal is output from the solid-state image pickup apparatus 904 and converted from analog form into digital form by the analog-to-digital converter 907. The resultant digital data is processed by the digital signal processing unit 908 and written in the memory 909 under the control of the general control/operation unit 912. The data stored in the memory 909 is then stored in the storage medium 914 via the storage medium control I/F unit 910 under the control of the general control/operation unit 912. The data stored in the memory 909 may be directly input to the computer or the like via the external device I/F unit 910.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-191208 filed Aug. 27, 2010, which is hereby incorporated by reference herein in its entirety.

What is claimed is:

1. A photoelectric conversion apparatus including a plurality of unit pixels each including a first photoelectric conversion unit, a second photoelectric conversion unit, a pixel output unit for outputting a signal based on an electric charge generated by at least one of the first and second photoelectric conversion units, a first transfer unit for transferring an electric charge generated by the first photoelectric conversion unit to the pixel output unit, a second transfer unit for transferring an electric charge generated by the second photoelectric conversion unit to the pixel output unit, and a resetting unit for resetting the first photoelectric conversion unit and the second photoelectric conversion unit, wherein the first photoelectric conversion unit is depleted when it is reset, and the second photoelectric conversion unit is not depleted when it is reset.

2. The photoelectric conversion apparatus according to claim 1, wherein the photoelectric conversion apparatus is selectively operable in a first mode and a second mode,
wherein in the first mode, the second transfer unit is in an on-state when the electric charge generated by the first photoelectric conversion unit is transferred by the first transfer unit, and in the second mode, the second transfer unit is in an off-state when the electric charge generated by the first photoelectric conversion unit is transferred by the first transfer unit.

3. The photoelectric conversion apparatus according to claim 1, further comprising a monitor unit for controlling an electric charge accumulation operation of the first photoelectric conversion unit associated with a signal output from the pixel output unit, based on the electric charge generated by the second photoelectric conversion unit.

4. The photoelectric conversion apparatus according to claim 3, wherein the monitor unit controls the electric charge accumulation operation of the first photoelectric conversion unit based on a difference between maximum and minimum values of signals output from the plurality of pixel output units.

5. The photoelectric conversion apparatus according to claim 1, wherein the plurality of unit pixels are arranged in a first direction, and the first and second photoelectric conversion units are arranged in a second direction.

6. The photoelectric conversion apparatus according to claim 5, wherein the second direction is perpendicular to the first direction.

7. The photoelectric conversion apparatus according to claim 1, wherein the first photoelectric conversion unit has a greater light receiving area than that of the light receiving area of the second photoelectric conversion unit.

8. A focus detection apparatus including the photoelectric conversion apparatus according to claim 1.

9. The focus detection apparatus according to claim 8, wherein the photoelectric conversion apparatus is selectively operable in a first mode and a second mode,
wherein in the first mode, the second transfer unit is in an on-state when the electric charge generated by the first photoelectric conversion unit is transferred by the first transfer unit, and in the second mode, the second transfer unit is in an off-state when the electric charge generated by the first photoelectric conversion unit is transferred by the first transfer unit.

10. The focus detection apparatus according to claim 8, wherein the photoelectric conversion apparatus further comprises a monitor unit for controlling an electric charge accumulation operation of the first photoelectric conversion unit associated with a signal output from the pixel output unit, based on the electric charge generated by the second photoelectric conversion unit.

11. The focus detection apparatus according to claim 10, wherein the monitor unit of the photoelectric conversion apparatus controls the electric charge accumulation operation of the first photoelectric conversion unit based on a difference between maximum and minimum values of signals output from the plurality of pixel output units.

12. The focus detection apparatus according to claim 8, wherein the plurality of unit pixels of the photoelectric conversion apparatus are arranged in a first direction, and the first and second photoelectric conversion units are arranged in a second direction.

13. The focus detection apparatus according to claim 12, wherein the second direction is perpendicular to the first direction.

14. The focus detection apparatus according to claim 8, wherein the first photoelectric conversion unit has a greater light receiving area than that of the light receiving area of the second photoelectric conversion unit.

15. An image pickup system including the focus detection apparatus according to claim 8.

16. The image pickup system according to claim 15,
wherein the photoelectric conversion apparatus is selectively operable in a first mode and a second mode,
wherein in the first mode, the second transfer unit is in an on-state when the electric charge generated by the first photoelectric conversion unit is transferred by the first transfer unit, and in the second mode, the second transfer unit is in an off-state when the electric charge generated by the first photoelectric conversion unit is transferred by the first transfer unit.

17. The image pickup system according to claim 15, wherein the photoelectric conversion apparatus further comprises a monitor unit for controlling an electric charge accumulation operation of the first photoelectric conversion unit associated with a signal output from the pixel output unit, based on the electric charge generated by the second photoelectric conversion unit.

18. The image pickup system according to claim 17, wherein the monitor unit of the photoelectric conversion apparatus controls the electric charge accumulation operation of the first photoelectric conversion unit based on a difference between maximum and minimum values of signals output from the plurality of pixel output units.

19. The image pickup system according to claim 15, wherein the plurality of unit pixels of the photoelectric conversion apparatus are arranged in a first direction, and the first and second photoelectric conversion units are arranged in a second direction.

20. The image pickup system according to claim 15, wherein the first photoelectric conversion unit has a greater light receiving area than that of the light receiving area of the second photoelectric conversion unit.

* * * * *